United States Patent [19]

Perloff

[11] Patent Number: 4,606,056
[45] Date of Patent: Aug. 12, 1986

[54] METHOD OF ENCODING AND SERIALLY TRANSMITTING SELF-CLOCKING DATA AND CONTROL CHARACTERS

[75] Inventor: Ronald S. Perloff, San Diego, Calif.

[73] Assignee: Burroughs Corporation, Detroit, Mich.

[21] Appl. No.: 698,138

[22] Filed: Feb. 4, 1985

[51] Int. Cl.⁴ .................. H04L 7/02; H04L 25/38; H04J 3/06
[52] U.S. Cl. .................. 375/110; 375/117; 340/825.14; 370/99; 370/48
[58] Field of Search ............ 375/117, 110, 106, 112; 370/48, 49, 110.1, 99; 340/825.14, 825.21

[56] References Cited

U.S. PATENT DOCUMENTS 4,208,650 6/1980 Horn .................. 375/117

FOREIGN PATENT DOCUMENTS 2643933 3/1978 Fed. Rep. of Germany ...... 375/117

Primary Examiner—Marc E. Bookbinder
Assistant Examiner—Andrew J. Telesz, Jr.
Attorney, Agent, or Firm—Charles J. Fassbender; Kevin R. Peterson

[57] ABSTRACT

A method of sending self-clocking data characters and control characters in a sequence from a first communications node to a second node includes the steps of: encoding each data character as respective code pairs of the form 0XX...X1 and 1XX...X0 where the X's are the zero and one bits of the data character; encoding each control character as respective code pairs of the form 0XX...X0 and 1XX...X1 where again the X's are the zero and one bits of the control character; and transmitting, for each character in said sequence, the particular code in that character's code pair whose first code bit is the opposite of the last code bit of the immediately preceding character in the sequence.

10 Claims, 4 Drawing Figures

METHOD OF ENCODING AND SERIALLY TRANSMITTING SELF-CLOCKING DATA AND CONTROL CHARACTERS

BACKGROUND OF THE INVENTION

This invention relates to digital communication networks; and, more particularly, it relates to methods of encoding and serially transmitting sequences of self-clocking data characters and control characters from one communication node to another in a local area network.

Briefly, a local area network is comprised of a plurality of communication nodes which are serially interconnected in a loop. Each node can be any type of data processing equipment, such as a disc, a printer, a video display or a computer. Data messages travel around the loop from one communication node to another until they pass through all nodes on the network, and an address field specifies which of the nodes the data message is for.

· Each data message is made up of a sequence of data characters; and each data character is made of a group of zero and one bits. Typically there are eight bits per character. Data characters are characters which are printed out by a printer, displayed on a screen by a video display, or stored for later retrieval in a disc.

But in addition to the data characters, control characters are also sent around the loop. One function of the control characters is that they format the data messages. For example, one control character may indicate where a data message begins; another control character may indicate where a data message ends; and still another control character may simply indicate that no data message is on the network,—i.e., that the network is in an idle mode. Another function of the control characters is to give commands or instructions to a node. For example, one control character may direct a node to enter a diagnostic mode of operation, another control character may direct a node to turn off, etc.

A common prior art method of encoding and serially transmitting data and control characters on a local area network is the F/2F encoding method. With the F/2F method, a zero is transmitted as a signal transition at the beginning and end of a bit period; and a one is transmitted as a signal transition at the beginning, middle, and end of a bit period.

Control characters in the F/2F method are transmitted as characters which contain violations of the above zero and one signal transitions. For example, the omission of a signal transition at the end of the first bit period of a character may indicate one control character; the omission of a signal transition at the end of the second bit period of a character may indicate another control character, etc.

A problem, however, with generating control characters as violations of normal F/2F encoding is that removing transitions from the edge of bits in the transmitted signal makes synchronizing a phase-locked oscillator to the signal quite difficult. Another problem with generating control characters as F/2F code violations is that the number of different characters that can be generated is quite limited. Yet another problem is that generating and receiving control characters as F/2F violations is very cumbersome since they have non-one and nonzero bits; and logic circuits only operate with ones and zeros. Also, a problem with F/2F encoding in general is that the encoded data requires a high bandwidth for transmissions.

Accordingly, a primary object of the invention is to provide an improved method of encoding and serially transmitting self-clocking data characters and control characters which avoids the above prior art problems.

BRIEF SUMMARY OF THE INVENTION

In one preferred method according to the present invention, a sequence of self-clocking control characters and data characters are encoded and serially transmitted from a first communications node to a second node by the steps of:

encoding the data characters as respective code pairs of the form 0XX . . . X1 and 1XX . . . X0 where the X's are the zero and one bits of each data character;

encoding the control characters as respective code pairs of the form 0XX . . . X0 and 1XX . . . X1 where again the X's are zero and one bits of each control character; and transmitting, for each character in a sequence, the particular code in that character's code pair whose first code bit is the opposite of the last code bit of the immediately preceding character in the sequence.

By this method, a signal transition occurs between each character, and so an oscillator can easily lock onto the encoded characters. Also with this method, both the control characters and data characters contain only one and zero bits; and thus no one and zero code violations are ever transmitted and so the required bandwidth of the channel is reduced. Further with this method, both the data characters and control characters are easily encoded and decoded with only a small amount of logic circuitry.

BRIEF DESCRIPTION OF THE DRAWINGS

Various features and advantages of the invention are described in the Detailed Description in conjunction with the accompanying drawings wherein.

DETAILED DESCRIPTION OF THE INVENTION

Figure 1A:
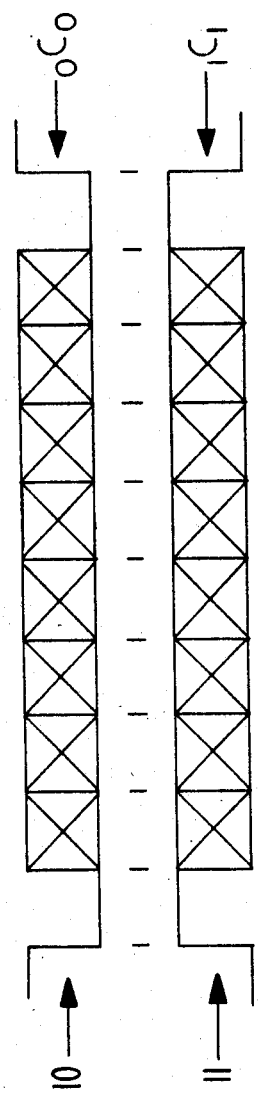
FIG. 1A illustrates two encoded forms for each control character in the present invention.

In the present invention, each control character has two encoded forms. These are indicated by reference numerals 10 and 11 in FIG. 1A. Each encoded control character 10 is of the form 0XX . . . X0, and each encoded control character 11 is of the form 1XX . . . X1. Here, the X's are the zero and one bits that represent the control character before it is encoded.

For example, an unencoded control character with bit pattern 11001100 is encoded with form 10 as 0110011000 and is encoded with form 11 as 1110011001. Similarly, an unencoded control character with bit pattern 00001111 is encoded with form 10 as 0000011110 and is encoded with form 11 as 1000011111.

A shorthand representation of code form 10 is $_0C_0$. Here C represents the unencoded control character, the subscript to the right of the C represents the code bit that is appended to the right of the unencoded control character, and the subscript to the left of the C represents the code bit that is appended to the left of the unencoded control character. Similarly, a shorthand representation of the code form 11 is $_1C_1$.

Figure 1B:
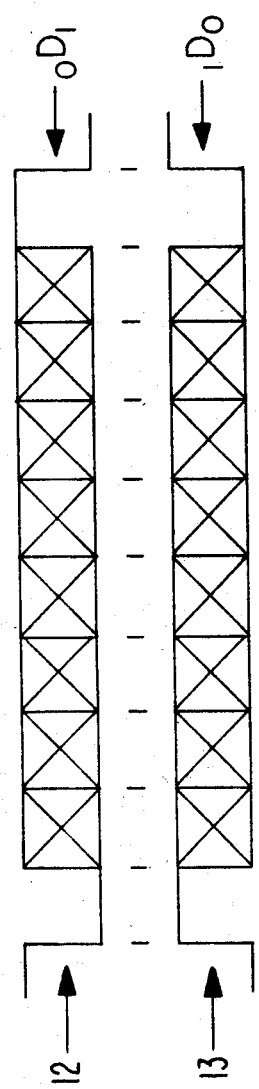
FIG. 1B illustrates two encoded forms for each data character in the present invention.

Also in the present invention, each data character has two encoded forms. These two forms are indicated by reference numerals 12 and 13 in FIG. 1B. Each encoded data character 12 is of the form 0XX . . . X1, and each encoded data character 13 is of the form 1XX . . . X0. Here, the X's are the zero and one bits that represent the data character before it is encoded.

For example, an unencoded data character with bit pattern 11001100 is encoded with form 12 as 0110011001 and is encoded with form 13 as 1110011000. Similarly, an unencoded data character with bit pattern 00001111 is encoded with form 12 as 0000011111 and is encoded with form 13 as 1000011110.

A shorthand representation of code form 12 is $_0D_1$. Here D represents the unencoded data character, the subscript to the right of the D represents the code bit that is appended to the right of the unencoded data character, and the subscript to the left of the D represents the code bit that is appended to the left of the unencoded data character. Similarly, a shorthand representation of code form 13 is $_1D_0$.

Which of the two code forms $_0C_0$ and $_1C_1$ that are utilized to encode a particular control character, and which of the two code forms $_0D_1$ and $_1D_0$ that are utilized to encode a particular data character when those characters are transmitted in a sequence from one communication node to another will now be described in conjunction with FIG. 2. As that figure illustrates, each character in a sequence is encoded such that its first code bit is the opposite of the last code bit of the immediately preceding character in the sequence.

Figure 2:
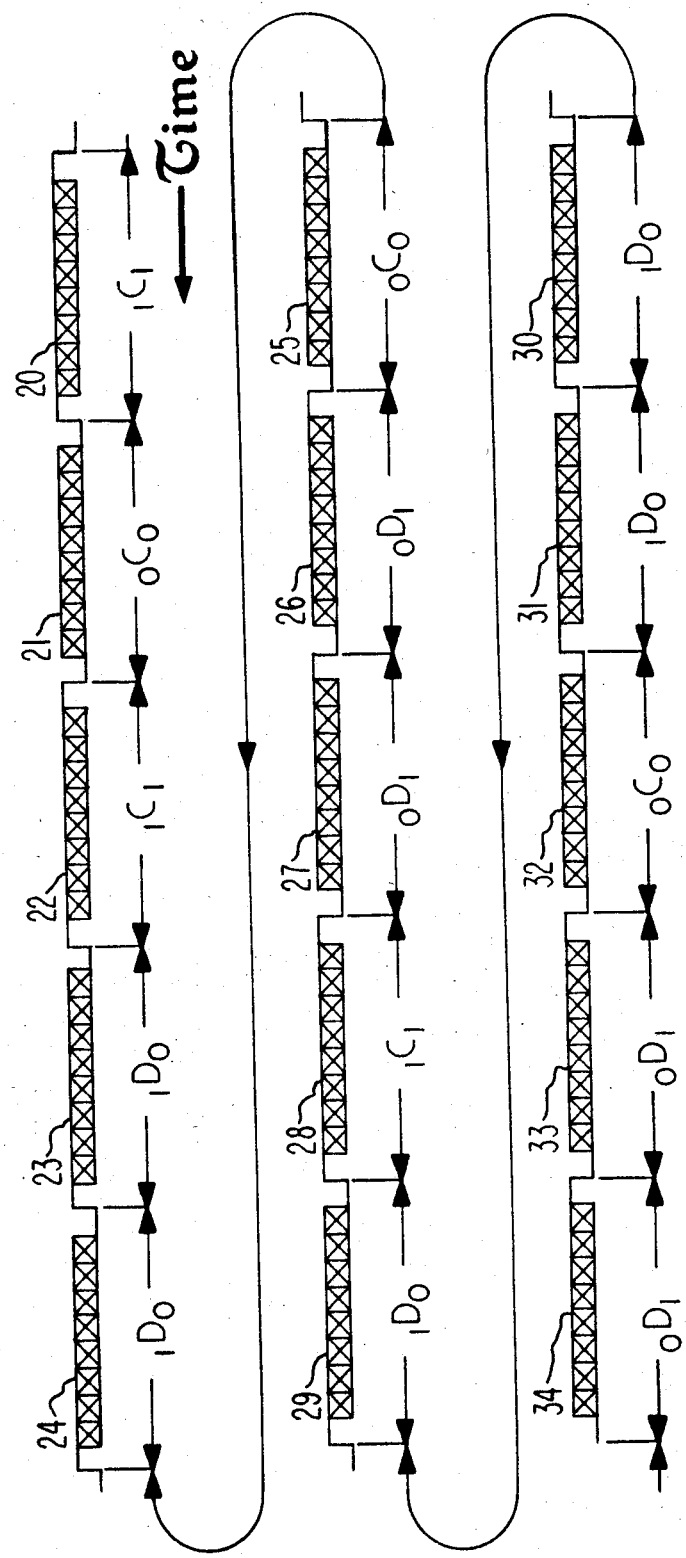
FIG. 2 illustrates how the code forms of FIGS. 1A and 1B are transmitted in a sequence such that a transition occurs between each encoded character.

In FIG. 2, the characters 20 thru 34 are transmitted in the sequence 20, 21, 22, . . . , etc. The first code bit of each character is shown on the right, and the last code bit is shown on the left. For example, the last code bit of character 20 is a one. Thus, character 21 is encoded such that its first bit or its rightmost bit is a zero.

Similarly, the last code bit of character 21 is a zero, so character 22 is encoded such that its first code bit is a one. Likewise, the last code bit of character 22 is a one, so character 23 is encoded such that its first code bit is a zero.

Since each control character has one encoded form that begins with a one and another encoded form that begins with a zero, there always exists an encoded form of the character where the first code bit is the opposite of the last code bit of the preceding character. Likewise, since each data character has one encoded form that begins with a zero and another encoded form that begins with a one, there always exists a code form where the first code bit is the opposite of the last code bit of the preceding character.

One feature of encoding and transmitting characters as described above is that the signal transition which always occurs between adjacent encoded characters can readily be locked onto by phase-locked oscillator (PLO) which in turn can provide clock signals to receive the transmitted character sequence. Preferably, at the beginning of a sequence, several control characters are transmitted which alternately are all one bits and all zero bits. This generates transitions only on the character boundaries and thereby enables the PLO to determine where one character ends and another begins.

Another feature of encoding and transmitting characters as described above is that the minimum bandwidth of the channel over which the characters are transmitted is relatively low. This is because, with the above encoding scheme, no more than one signal transition occurs for each bit that is transmitted. By comparison, in the F/2F method of encoding, two signal transitions can occur for each one bit of data character.

Thus, for example, suppose the minimum pulse width that can be sent over a channel is T. Then to send an eight-bit character and two code bits according to the present invention would take $(8+2)T$ or 10T. But to send one eight-bit character by the F/2F method would take $(8 \times 2)T$ or 16T.

Still another feature of encoding and transmitting characters as described above is the ease with which a character is encoded and decoded. Encoding a character merely involves the appending of a code bit before and behind the unencoded character; and deciphering an encoded character to determine whether it is data or control information merely involves the examining of the two appended code bits. Thus the encoding and decoding steps can be performed quickly and with relatively simple circuitry.

Still another feature of encoding and transmitting as described above is that the total number of control characters for any given code length is quite large. For example, when the encoded characters are ten bits long, there are a total of 256 control characters (and 256 data characters). By comparison, with the F/2F method, it is not possible to generate such a large number of control characters as code violations. To circumvent this problem, a particular control character may indicate that the following data character is to be interpreted as carrying control information. But that method is slow and inefficient since it requires that two (or more) characters be decoded in sequence to detect control information.

Figure 3:
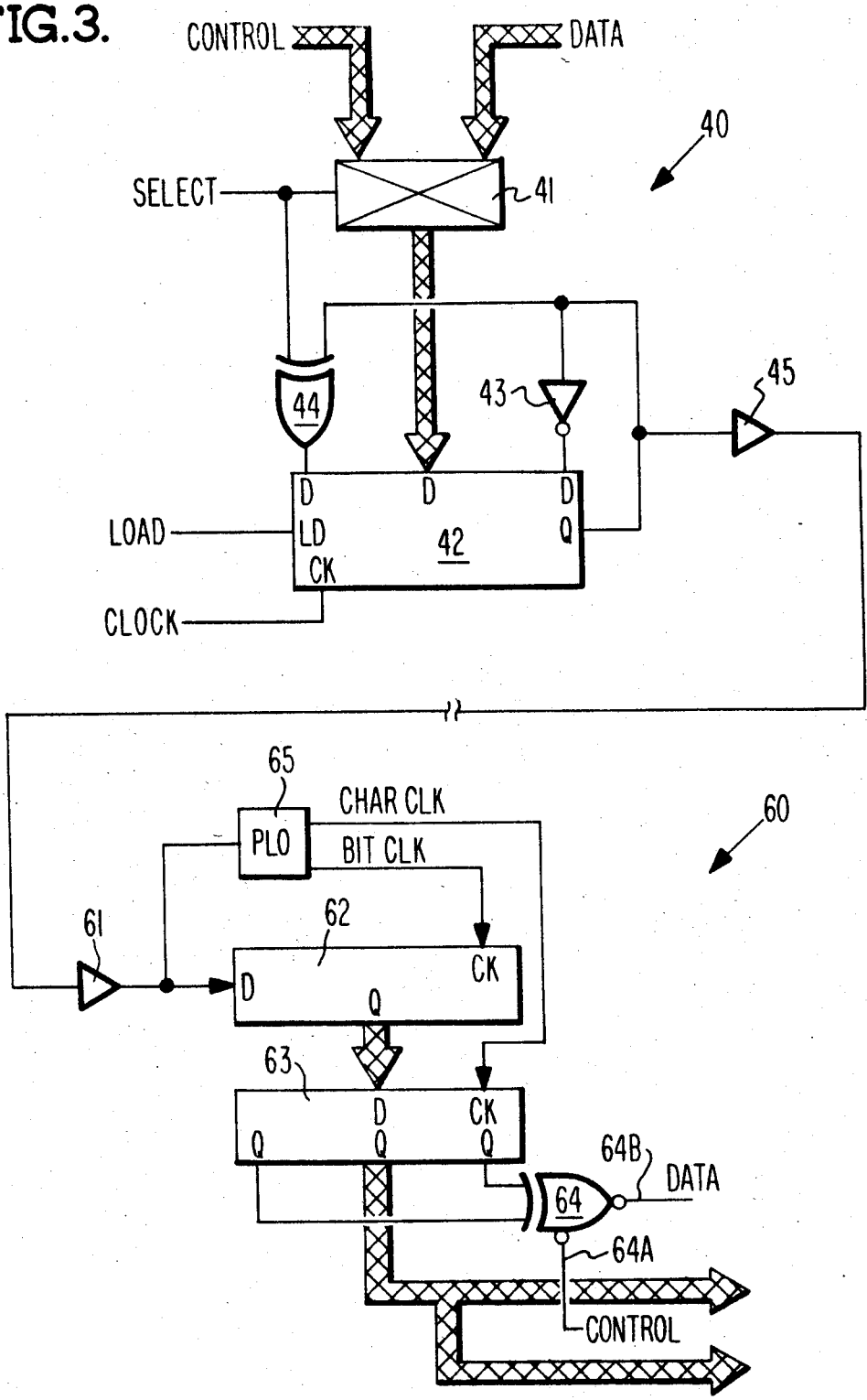
FIG. 3 illustrates a logic diagram of a circuit for transmitting codes in accordance with the invention and a logic diagram of a circuit for receiving those codes.

Turning to FIG. 3, a circuit 40 will be described which encodes and transmits control and data characters in accordance with the invention. This circuit includes a 2:1 multiplexer 41, a parallel-serial register 42, an inverter 43, an exclusive OR gate 44, and a transmitter 45. All of these components are interconnected as illustrated in FIG. 3.

In operation, control characters and data characters are loaded into register 42 in the sequence in which they are to be transmitted. As each character is loaded, one code bit is also loaded in front of that character and another code bit is loaded behind the character. This forms the encoded character in register 42. Then the encoded character is serially shifted to the right for transmission; and as the last bit is being transmitted, the above operation is repeated.

To load a control character into register 42, the SELECT signal to multiplexer 41 is set to a one. Conversely, to load a data character into register 42, the SELECT signal is set to a zero. Loading occurs when the LOAD signal is a one and the CLOCk signal to register 42 makes a transition from a zero to a one. Shifting occurs when the LOAD signal is a zero and the CLOCK signal makes a zero to one transition.

Logic gate 43 generates the code bit that is appended before the character which is loaded into register 42, and logic gate 44 generates the code bit that is appended behind the character that is loaded into register 42. Gates 43 and 44 both generate a one if a control character is being loaded and the last bit of the preceding encoded character is a zero. At the time of loading, that last bit is the Q output of register 42. Gate 43 generates a one if a data character is being loaded and the last bit of the preceding encoded character is a zero; and gate 44 generates a one if a data character is being loaded and the last bit of the preceding encoded characters is a one.

FIG. 3 also illustrates a circuit 60 for receiving and deciphering the transmitted encoded characters. Circuit 60 includes a receiver 61, a serial-parallal register 62, another register 63, an exclusive OR gate 64, and a phase-locked oscillator 65. All of these components are interconnected as illustrated in FIG. 3.

In operation, the encoded characters pass through receiver 61 and into the oscillator 65 which locks into the signal transitions between the characters. A BITCLK signal from the phase-locked oscillator 65 shifts the encoded signals through register 62. Then, after a complete character has been shifted into register 62, oscillator 65 sends a CHARCLK signal to register 63; and in response thereto, the contents of register 62 are loaded into register 63.

Gate 64 monitors the code bits that are before and behind the character in register 63 to determine whether it is a data character or a control character. If both code bits are a one or both code bits are a zero, gate 64 generates a CONTROL signal on an output lead 64a indicating the presence of a control character; otherwise, gate 64 generates a DATA signal on an output lead 64b indicating the presence of a data character. Once the determination is made that the character in register 63 is a control character, the receiving node can take whatever action is dictated by the bits of the particular character.

All of the steps for encoding and transmitting characters in accordance with the invention, as well as circuitry for performing those steps, have not been described in detail. In addition, however, many changes and modifications can be made to these details without departing from the nature and spirit of the invention.

For example, in the figures, a one bit is shown as a high voltage and a zero bit is shown as a low voltage; but as an alternative, a one bit can be sent as a low voltage and a zero bit sent as a high voltage. Also in the figures, the number of X's in each code pair is shown as eight; but that number preferably ranges anywhere between two and thirty-two. With a large number of X's, the signal transitions between characters occur too infrequently to maintain a good lock with the oscillator 65.

Also in the figures, control characters are shown as having the same first and last code bits and data characters are shown as having different first and last code bits; but as an alternative, a control characters can have different first and last code bits and data characters can have the same first and last code bits. That is, forms 10 and 11 in FIG. 1A can be encoded data characters, and forms 12 and 13 in FIG. 1B can be encoded control characters.

As still another alternative, forms 10 and 12 can be encoded data characters, and forms 11 and 13 can be encoded control characters. Similarly, forms 10 and 12 can be encoded control characters, and forms 11 and 13 can be encoded data characters.

Accordingly, it is to be understood that the invention is not limited to the above described details but is defined by the appended claims.

What is claimed is:

1. A method of sending a plurality of self-clocking data characters and control characters in a sequence from a first communication node to a second node, including the steps of:
   loading the characters of said sequence into a parallel-serial shift register;
   inserting a one bit before and a one bit behind each loaded control character which is immediately preceded by a zero bit of a previously loaded character, and a zero bit before and a zero bit behind each remaining control character;
   inserting a one bit before and a zero bit behind each loaded data character which is immediately preceded by a zero bit of a previously loaded character, and a zero bit before and a one bit behind each remaining data character; and
   serially transmitting each loaded character with its inserted bits.

2. A method according to claim 1 wherein said characters are sequentially loaded one at a time into said shift register, and said inserting steps are performed on each character as it is loaded.

3. A method of sending a plurality of self-clocking data characters and control characters in a sequence from a first communications node to a second node, including the steps of:
   encoding said data characters as respective code pairs of the form 0XX...X1 and 1XX...X0 where the X's are the zero and one bits of the unencoded character;
   encoding said control characters as respective code pairs of the form 0XX...X0 and 1XX...X1 where again the X's are zero and one bits of the unencoded character;
   transmitting, for each character in said sequence, the particular code in that character's code pair whose first code bit is the opposite of the last code bit of the immediately preceding character in the sequence;
   establishing an initial mode of operation in said second node to receive said codes; and
   changing operating modes from said initial mode in response to the receipt of only those codes of the form 0XX...X0 and 1XX...X1 regardless of the location of such codes in said sequence.

4. A method according to claim 3 wherein the number of X's in the code of each code pair is between two and thirty-two.

5. A method according to claim 3 and further including the substep of sequentially encoding said characters such that while one character of said sequence is being transmitted, the next character in said sequence is being encoded.

6. A method of sending a plurality of self-clocking data characters and control characters in a sequence from a first communications node to a second node, including the steps of:
   encoding said data characters as respective code pairs of the form 1XX...X1 and 1XX...X0 where the X's are the zero and one bits of the unencoded character;
   encoding said control characters as respective code pairs of the form 0XX...X0 and 0XX...X1 where again the X's are the zero and one bits of the unencoded character;
   transmitting, for each character in said sequence, the particular code in that character's code pair whose first code bit is the opposite of the last code bit of the immediately preceding character in the sequence;

establishing an initial mode of operation in said second node to receive said codes; and changing operating modes from said initial mode in response to the receipt of only those codes of the form 0XX . . . X0 and 0XX . . . X1 regardless of the location of such codes in the sequence.

7. A method according to claim 6 wherein the number of X's in the code of each code pair is between two and thirty-two.

8. A method according to claim 6 and further including the substep of sequentially encoding said characters such that while one character of said sequence is being transmitted, the next character in said sequence is being encoded.

9. A method of sending a plurality of self-clocking data characters and control characters in a sequence from a first communications node to a second node, including the steps of:

encoding said data characters as respective code pairs of the form 0XX . . . X0 and 1XX . . . X1 where the X's are the zero and one bits of the unencoded character;

encoding said control characters as respective code pairs of the form 0XX . . . X1 and 1XX . . . X0 where again the X's are zero and one bits of the unencoded character;

transmitting, for each character in said sequence, the particular code in that character's code pair whose first code bit is the opposite of the last code bit of the immediately preceding character in the sequence;

establishing an initial mode of operation in said second node to receive said codes; and changing operating modes from said initial mode in response to the receipt of only those codes of the form 0XX . . . X1 and 1XX . . . X0 regardless of the location of such codes in said sequence.

10. A method of sending a plurality of self-clocking data characters and control characters in a sequence from a first communications node to a second node, including the steps of:

encoding said data characters as respective code pairs of the form 0XX . . . X0 and 0XX . . . X1 where the X's are the zero and one bits of the unencoded character;

encoding said control characters as respective code pairs of the form 1XX . . . X1 and 1XX . . . X0 where again the X's are the zero and one bits of the unencoded character;

transmitting, for each character in said sequence, the particular code in that character's code pair whose first code bit is the opposite of the last code bit of the immediately preceding character in the sequence;

establishing an initial mode of operation in said second node to receive said codes; and changing operating modes from said initial mode in response to the receipt of only those codes of the form 1XX . . . X1 and 1XX . . . X0 regardless of the location of such codes in the sequence.

* * * * *